(12) United States Patent
Ao et al.

(10) Patent No.: US 12,376,451 B2
(45) Date of Patent: Jul. 29, 2025

(54) LIGHT-EMITTING DEVICE AND FABRICATION METHOD THEREOF

(71) Applicant: TCL TECHNOLOGY GROUP CORPORATION, Huizhou (CN)

(72) Inventors: Zitong Ao, Huizhou (CN); Yiran Yan, Huizhou (CN); Fan Yang, Huizhou (CN); Xuesen Lai, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 500 days.

(21) Appl. No.: 17/952,961

(22) Filed: Sep. 26, 2022

(65) Prior Publication Data

US 2023/0027367 A1    Jan. 26, 2023

Related U.S. Application Data

(63) Continuation of application No. PCT/CN2020/141668, filed on Dec. 30, 2020.

(30) Foreign Application Priority Data

Jul. 16, 2020 (CN) .......................... 202010686296.2

(51) Int. Cl.
*H10K 50/852* (2023.01)
*H10K 50/15* (2023.01)
(Continued)

(52) U.S. Cl.
CPC ........... *H10K 50/852* (2023.02); *H10K 50/15* (2023.02); *H10K 50/16* (2023.02); *H10K 50/17* (2023.02);
(Continued)

(58) Field of Classification Search
None
See application file for complete search history.

(56) References Cited

U.S. PATENT DOCUMENTS 6,711,200 B1    3/2004    Scherer et al.

FOREIGN PATENT DOCUMENTS

| CN | 106654027 A | 5/2017 |
|---|---|---|
| CN | 107994125 A | 5/2018 |

(Continued)

OTHER PUBLICATIONS

World Intellectual Property Organization (WIPO) International Search Report for PCT/CN2020/141668 Apr. 26, 2021 5 Pages (Including Translation).

*Primary Examiner* — Anthony Ho
(74) *Attorney, Agent, or Firm* — ANOVA LAW GROUP, PLLC

(57) ABSTRACT

A fabrication method for a light-emitting device includes providing a hole functional layer disposed between a quantum dot light-emitting layer and an anode, and providing an electron functional layer disposed between the quantum dot light-emitting layer and a cathode. The hole functional layer includes a mixed material of a hole transport material and a hole injection material. A thickness of the hole functional layer being selected from a thickness range corresponding to ⅓~⅔ of abscissa between an origin and a first positive trough in a cavity standing wave of the mixed material. The absolute value of a difference between a thickness of the electron functional layer and a thickness corresponding to a first positive crest of a cavity standing wave of an electron functional material is less than or equal to 5 nm.

20 Claims, 3 Drawing Sheets

(51) Int. Cl.
*H10K 50/16* (2023.01)
*H10K 50/17* (2023.01)
*H10K 71/00* (2023.01)
*H10K 85/40* (2023.01)
*H10K 85/60* (2023.01)
H10K 50/818 (2023.01)
H10K 102/00 (2023.01)
H10K 102/10 (2023.01)

(52) U.S. Cl.
CPC ............ *H10K 71/00* (2023.02); *H10K 85/40* (2023.02); *H10K 85/631* (2023.02); *H10K 85/654* (2023.02); *H10K 85/6565* (2023.02); *H10K 85/6576* (2023.02); *H10K 50/818* (2023.02); *H10K 2102/00* (2023.02); *H10K 2102/102* (2023.02); *H10K 2102/351* (2023.02)

(56) References Cited

FOREIGN PATENT DOCUMENTS

| | | | |
|---|---|---|---|
| CN | 109390488 | A | 2/2019 |
| CN | 109980105 | A | 7/2019 |
| CN | 111384279 | A | 7/2020 |
| JP | 2019040990 | A | 3/2019 |

```
┌─────────────────────────────────────────────┐
│ provide a hole functional layer disposed between a   │
│ quantum dot light-emitting layer and an anode, where the│
│ hole functional layer includes a mixed material of a hole│ ─── S10
│ transport material and a hole injection material, and a │
│ thickness of the hole functional layer is selected from a│
│ thickness range corresponding to 1/3~2/3 of abscissa │
│ between an origin and a first positive trough in a cavity│
│ standing wave of the mixed material                  │
└─────────────────────────────────────────────┘
                        │
                        ▼
┌─────────────────────────────────────────────┐
│ provide an electron functional layer disposed between the│
│ quantum dot light-emitting layer and a cathode, where an │
│ absolute value of a difference between a thickness of the│ ─── S20
│ electron functional layer and a thickness corresponding to│
│ a first positive crest of a cavity standing wave of an   │
│ electron functional material is less than or equal to 5 nm│
└─────────────────────────────────────────────┘
```

FIG. 1

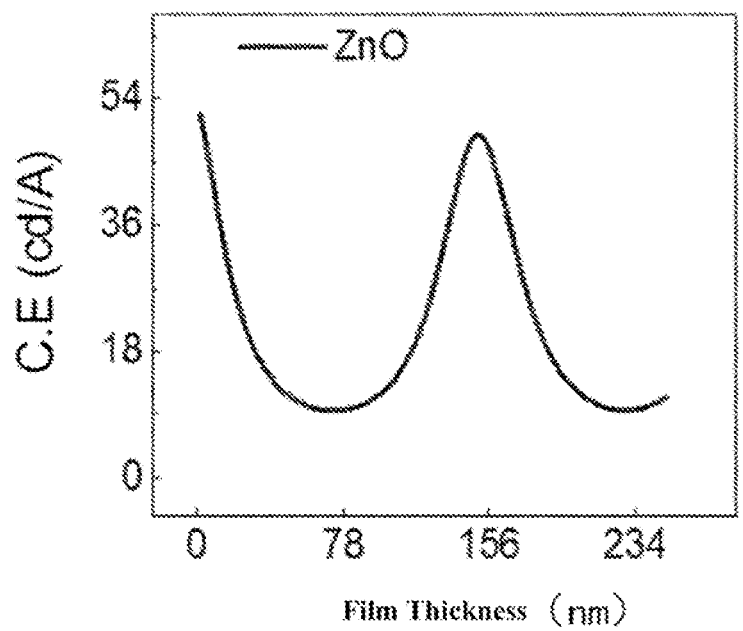

FIG. 2

LIGHT-EMITTING DEVICE AND FABRICATION METHOD THEREOF

CROSS-REFERENCE TO RELATED APPLICATIONS

This application is a continuation of International Application No. PCT/CN2020/141668, filed on Dec. 30, 2020, which claims priority to the Chinese Patent Application No. 202010686296.2, filed on Jul. 16, 2020, the entire contents of both of which are incorporated herein by reference.

TECHNICAL FIELD

The present disclosure relates to the technical field of optoelectronic devices and, more particularly, to a light-emitting device and a fabrication method thereof.

BACKGROUND

The statements in this paper only provide background information related to the present disclosure, and do not necessarily constitute prior art. When a light-emitting region of a device is located in a resonant cavity formed by a total reflection film and a semi-reflection film, and the cavity length is in the same order of magnitude as that of the wavelength of the light, the light having the specific wavelength is selected and enhanced, and the light spectrum is narrowed. This is the microcavity effect. Since light-emitting devices, especially top-emitting devices, can have a microcavity effect and have good external quantum efficiency and current efficiency, these devices have received extensive attention in the field of QLED research and development in recent years. Therefore, a top-emitting structure electroluminescent device can have many unique advantages. For example, adding a cap layer on top of the device can improve the coupling output of light, eliminate the energy loss caused by the optical waveguide effect of the glass substrate, and improve the color purity of the display device, etc. However, because of the spectrum and full width at half maximum of the blue-green quantum dot material, the first crest value in its cavity standing wave closest to the origin is negative. As such, it is impossible to place the light-emitting layer on the first crest of the cavity standing wave by changing the thickness of each layer in the blue-green quantum dot device, which leads to a decrease in the performance of the blue-green quantum dot top-emitting device. On one hand, even if thinning each of the functional layers can make the light-emitting layer of the device approach the first crest of the cavity standing wave, and the optical performance thereof can be improved, the too thin layer of film may cause the device to break down when the device is energized. On the other hand, in order to have the optical performance of the device reach the crest value of blue-green quantum dots, each film layer may be thickened so that the light-emitting layer can be placed at the second crest of the cavity standing wave; however, the device resistance may be increased due to the increase in the thickness of each film layer in the device structure, causing a decrease of the electrical properties of the device.

Therefore, at present, quantum dot light-emitting devices, especially blue-green quantum dot top-emitting devices, cannot achieve ideal electrical and optical properties. It is also difficult to significantly improve the working life of quantum dot light-emitting devices.

SUMMARY

Technical Problem

One of the purposes of the embodiments of the present disclosure is to provide a light-emitting device and a fabrication method thereof, aiming at solving the technical problem of poor electrical and optical properties of the light-emitting device.

Technical Solutions

In order to solve the above-mentioned technical problems, the technical solutions adopted in the embodiments of the present disclosure are as follows.

A first aspect provides a fabrication method of a light-emitting device, which includes the following steps.

A hole functional layer is disposed between a quantum dot light-emitting layer and an anode. The hole functional layer includes a mixed material of a hole transport material and a hole injection material. The thickness of the hole functional layer is selected from a thickness range corresponding to $1/3 \sim 2/3$ of the abscissa between the origin and the first positive trough in the cavity standing wave of the mixed material; and/or, An electron functional layer is disposed between the quantum dot light-emitting layer and a cathode. An absolute value of a difference between a thickness of the electron functional layer and a thickness corresponding to a first positive crest of a cavity standing wave of the electron functional material is less than or equal to 5 nm.

A second aspect provides a light-emitting device including an anode and a cathode disposed opposite to each other, a quantum dot light-emitting layer disposed between the anode and the cathode, a hole functional layer disposed between the anode and the quantum dot light-emitting layer, and an electron functional layer disposed between the cathode and the quantum dot light-emitting layer. The hole functional layer includes a mixed material of a hole transport material and a hole injection material. The thickness of the hole functional layer is selected from the thickness range corresponding to $1/3 \sim 2/3$ of the abscissa between the origin and the first positive trough in the cavity standing wave of the mixed material; and/or, an absolute value of a difference between a thickness of the electron functional layer and a thickness corresponding to a first positive crest of a cavity standing wave of the electron functional material is less than or equal to 5 nm.

Beneficial Effects

The beneficial effects of the fabrication method of a light-emitting device provided by the embodiments of the present disclosure are that the hole functional layer including a mixed material of the hole transport material and the hole injection material is arranged between the quantum dot light-emitting layer and the anode, where the thickness of the hole functional layer is selected from the thickness range corresponding to $1/3 \sim 2/3$ of the abscissa between the origin and the first positive trough in the cavity standing wave of the mixed material; or, the electron functional layer is disposed between the quantum dot light-emitting layer and the cathode, where the absolute value of the difference between the thickness of the electron functional layer and the thickness corresponding to a first positive crest of a cavity standing wave of the electron functional material is less than or equal to 5 nm; or, the hole functional layer including a mixed material of the hole transport material and the hole injection material is arranged between the quantum-dot light-emitting layer and the anode, where the thickness of the hole functional layer is selected from the thickness corresponding to ⅓~⅔ of the abscissa between the origin and the first positive trough in the cavity standing wave of the mixed material, and the electron functional layer is disposed between the quantum dot light-emitting layer and the cathode, where the absolute value of the difference between the thickness of the electron functional layer and the thickness corresponding to a first positive crest of a cavity standing wave of the electron functional material is less than or equal to 5 nm. In the fabrication method provided in the present disclosure, on one hand, the hole functional layer is fabricated by mixed doping of the hole transport material and the hole injection material, and the thickness of the hole functional layer is selected from the thickness range corresponding to ⅓~⅔ of the abscissa between the origin and the first positive trough in the cavity standing wave of the mixed material. Because of the device microcavity effect, the thickness of the hole functional layer can be closer to the thickness corresponding to the crest of the cavity standing wave closest to the origin, the device can have better current efficiency and luminous efficiency, and have improved optical performance. In addition, the composite hole functional layer made of mixed materials can reduce internal interfaces of the device, and the device only needs a single hole functional layer. Compared with respectively providing the hole injection layer and the hole transport layer, the single composite hole functional layer reduces the thickness of the hole functional layer, reduces the interface impedance and resistance of the hole functional layer, improves the injection and transmission efficiency of holes, facilitates the charge balance in the light-emitting layer, and further improves luminous efficiency of the device. On the other hand, the thickness of the electron functional layer may be set close to the thickness corresponding to the first positive crest in the cavity standing wave of the electron functional material, and the thickness difference is within 5 nm, so that the device can be located near the first positive crest in the cavity standing wave. At such position, the device can have better current efficiency, better light emitting efficiency, and improved optical performance of the device. Moreover, with the thickening of the electron functional layer, the injection efficiency of electrons is slowed down, the quenching phenomenon caused by the injection efficiency of electrons in the device being higher than the injection efficiency of holes can be avoided, so as to improve a balance of the recombination of electrons and holes in the light-emitting layer, and improve the luminescence efficiency of the device. In the fabrication method of the light-emitting device provided by the present disclosure, by adjusting the hole functional layer and/or the electron functional layer, the injection efficiency of electrons and holes in the light-emitting layer can be better balanced, and the recombination efficiency of electrons and holes can be improved, thereby improving the luminous efficiency of the device, and prolonging the working life of the device. In addition, the fabrication method is easy to operate, and is thus suitable for large-scale industrial production and application.

The beneficial effects of the light-emitting device provided by the embodiments of the present disclosure are that the hole functional layer disposed between the anode and the quantum dot light-emitting layer includes a mixed material of a hole transport material and a hole injection material, and the thickness of the hole functional layer is selected from the thickness range corresponding to ⅓~⅔ of the abscissa between the origin and the first positive trough in the cavity standing wave of the mixed material. The hole functional layer having a thickness closer to the thickness corresponding to the crest of the cavity standing wave is fabricated by material mixed doping, which improves the current efficiency and luminous efficiency of the device, reduces internal interfaces of the device, reduces the thickness of the hole functional layer, reduces the interface impedance and resistance of the hole functional layer, improves the injection and transmission efficiency of holes, facilitates the charge balance in the light-emitting layer, and further improves luminous efficiency of the device. The absolute value of the difference between the thickness of the electron functional layer between the cathode and the quantum dot light-emitting layer and the thickness corresponding to the first positive crest in the cavity standing wave of the electron functional material is equal to 5 nm, so that the device is located in the vicinity of the first positive crest in the cavity standing wave. At such position, the device has better current efficiency and light emitting efficiency, and improved optical performance. Moreover, the recombination efficiency of electrons and holes in the light-emitting layer can be balanced, and the light-emitting efficiency of the device can be improved.

BRIEF DESCRIPTION OF THE DRAWINGS

In order to illustrate the technical solutions in the embodiments of the present disclosure more clearly, the following briefly introduces the accompanying drawings that are used in the description of the embodiments or exemplary technologies. Obviously, the drawings in the following description are only some embodiments of the present disclosure. For those of ordinary skill in the art, other drawings can also be obtained according to these drawings without any creative effort.

FIG. 1 is a schematic diagram of a method for preparing a top-emitting device according to some embodiments of the present disclosure.

FIG. 2 schematically shows a relationship graph of a thickness of ZnO with respect to a current efficiency of a green quantum dot top-emitting device according to Embodiment 1 of the present disclosure.

DETAILED DESCRIPTION OF THE EMBODIMENTS

Figure 3:
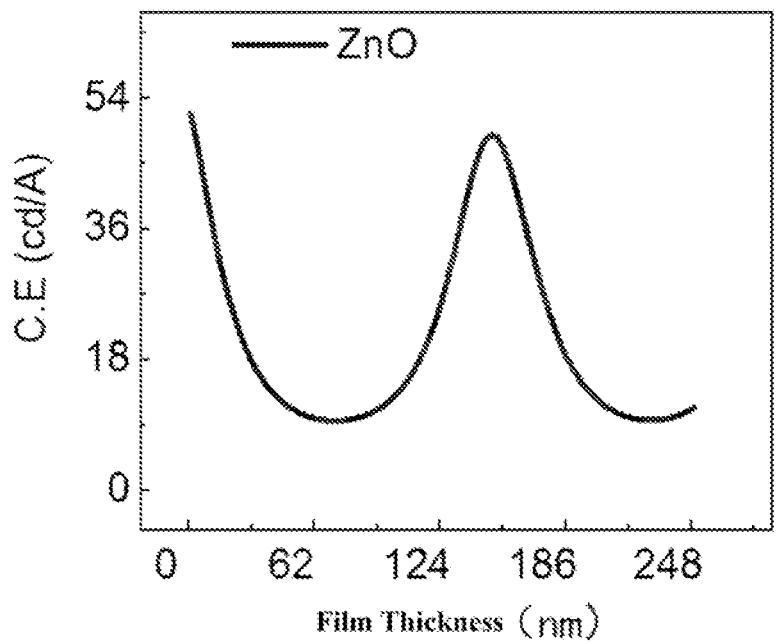
FIG. 3 schematically shows a relationship graph of a thickness of ZnO with respect to a current efficiency of a green quantum dot top-emitting device according to Embodiment 3 of the present disclosure.

In order to make the objectives, technical solutions, and advantages of the present disclosure clearer, the present disclosure is further described in detail below with reference to the accompanying drawings and embodiments. It should be understood that the specific embodiments described herein are only used to explain the present invention, but not to limit the present disclosure.

It should be noted that when a component is referred to as being "fixed to" or "disposed at" another component, the component can be directly on the other component or indirectly on the other component. When a component is referred to as being "connected to" another component, the component can be directly or indirectly connected to the other element. The orientation or positional relationships indicated by the terms "upper," "lower," "left," "right," etc., are based on the orientation or positional relationship shown in the drawings, and are only for the convenience of description, rather than indicating or implying that the referred device or element must have the specific orientation or must be constructed and operated in a specific orientation, and these terms therefore should not be construed as a limitation on the present disclosure. Those of ordinary skill in the art can understand the specific meanings of the above terms according to specific situations. The terms "first" and "second" are only used for convenience of description, and should not be understood as indicating or implying relative importance or implying or indicating a quantity of technical features. "Plurality" means two or more, unless expressly specifically limited otherwise.

In order to illustrate the technical solutions provided by the present disclosure, below provides detailed description with reference to the specific drawings and embodiments.

As shown in FIG. 1, some embodiments of the present disclosure provide a method for preparing a light-emitting device, and the method includes the following steps.

S10. A hole functional layer is provided between the quantum dot light-emitting layer and the anode, where the hole functional layer includes a mixed material of a hole transport material and a hole injection material, and a thickness of the hole functional layer is selected from the thickness range corresponding to ⅓~⅔ of the abscissa between the origin and the first positive trough in the cavity standing wave of the mixed material; and/or, S20. An electron functional layer is disposed between the quantum dot light-emitting layer and a cathode. An absolute value of a difference between a thickness of the electron functional layer and a thickness corresponding to a first positive crest of a cavity standing wave of the electron functional material is less than or equal to 5 nm.

The cavity standing wave of the materials in the embodiments of the present disclosure refers to: after the materials are made into functional films of different thicknesses and applied to light-emitting devices, a relationship curve of the current efficiency of the device with respect to a thickness of the functional films can be obtained. The curve of the current efficiency of the device varying with the thickness of the functional films can be the cavity standing wave of the material. As shown in FIG. 2, in the graph showing the relationship between the thickness of the ZnO film and the current efficiency of the device, the relationship curve of the current efficiency of the device with respect to the thickness of the ZnO film is the cavity standing wave of ZnO.

The first positive trough in the embodiments of the present disclosure refers to that, in the cavity standing wave of the material, with point 0 as the origin, the first positive trough in the positive direction of the abscissa is the first positive trough. As shown in FIG. 2, the position of the cavity standing wave on the abscissa corresponding to a film thickness of 78 nm is the first positive trough. From this trough position, the film thickness in the positive direction (thickening) or the negative direction (thinning) will lead to increase of the current efficiency of the device.

The first positive crest in the embodiment of the present disclosure refers to that, in the cavity standing wave of the material, with point 0 as the origin, the first positive crest in the positive direction of the abscissa is the first positive crest. As shown in FIG. 2, the position of the cavity standing wave on the abscissa corresponding to the film thickness of 156 nm is the first positive crest. From the crest position, either the film thickness in the positive direction (thickening) or the negative direction (thinning) leads to decrease of the current efficiency of the device.

Figure 4:
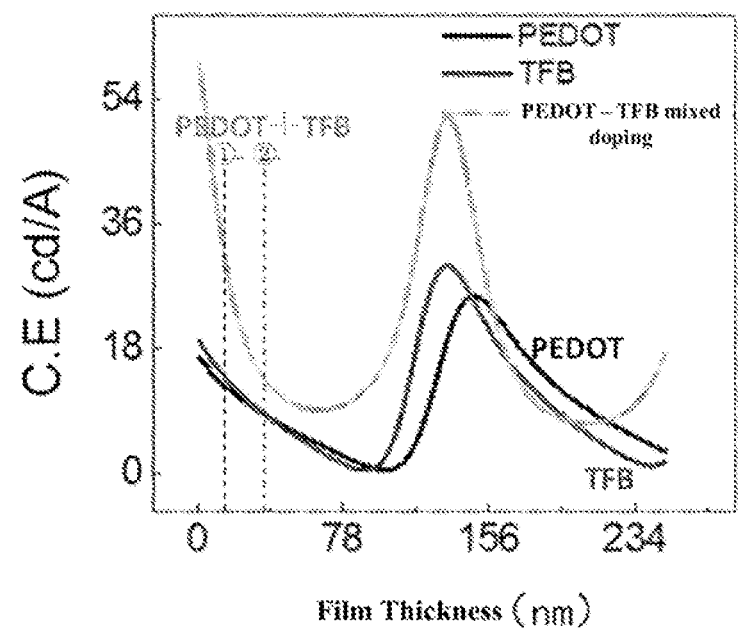
FIG. 4 schematically shows a relationship graph of a thickness of PEDOT, TFB and PEDOT-doped TFB with respect to a current efficiency of the green quantum dot top-emitting device in Embodiment 2 and the comparative example 1 of the present disclosure.

The thickness of the hole functional layer in the embodiment of the present disclosure may be in the thickness range corresponding to ⅓~⅔ of the abscissa between the origin and the first positive trough in the cavity standing wave of the mixed material, that is, the thickness is, in the cavity standing wave curve of the current efficiency of the device increasing with the thickness of the hole functional layer film of the present disclosure, in a thickness range corresponding to ⅓~⅔ of an interval from the abscissa of the origin (point 0) to the abscissa of the first positive trough. As shown in FIG. 4, in the cavity standing wave curve of the thickness of the hole functional layer made of the PEDOT-doped TFB mixed material and the current efficiency of the device, the abscissa corresponding to the first positive trough is about 65 nm. In order to ensure the current efficiency of the hole functional layer and avoid the problem that the hole functional layer is too thin and the device is easily broken down when the device is energized, the thickness of the hole functional layer is the thickness range corresponding to ⅓ to ⅔ of the interval from the abscissa of the origin of the cavity standing wave to the abscissa of the first positive trough, e.g., the interval between 21 nm and 44 nm corresponding to the first dashed line and the second dashed line, respectively, shown in FIG. 4.

In the fabrication method of the light-emitting device provided in the embodiment of the present disclosure, the hole functional layer including a mixed material of the hole transport material and the hole injection material is arranged between the quantum-dot light-emitting layer and the anode, where the thickness of the hole functional layer is selected from the thickness range corresponding to ⅓~⅔ of the abscissa between the origin and the first positive trough in the cavity standing wave of the mixed material; or, the electron functional layer is disposed between the quantum dot light-emitting layer and the cathode, where the absolute value of the difference between the thickness of the electron functional layer and the thickness corresponding to a first positive crest of a cavity standing wave of the electron functional material is less than or equal to 5 nm; or, the hole functional layer including a mixed material of the hole transport material and the hole injection material is arranged between the quantum-dot light-emitting layer and the anode, where the thickness of the hole functional layer is selected from the thickness corresponding to ⅓~⅔ of the abscissa between the origin and the first positive trough in the cavity standing wave of the mixed material, and the electron functional layer is disposed between the quantum dot light-emitting layer and the cathode, where the absolute value of the difference between the thickness of the electron functional layer and the thickness corresponding to a first positive crest of a cavity standing wave of the electron functional material is less than or equal to 5 nm. In the fabrication method provided in the present disclosure, on one hand, the hole functional layer is fabricated by mixed doping of the hole transport material and the hole injection material, and the thickness of the hole functional layer is selected from the thickness range corresponding to ⅓~⅔ of the abscissa between the origin and the first positive trough in the cavity standing wave of the mixed material. Due to the device microcavity effect, the thickness of the hole functional layer can be closer to the thickness corresponding to the crest of the cavity standing wave closest to the origin, the problem can be avoided that the hole functional layer is too thin and the device is easily broken down when the device is energized, so that the device can have better current efficiency and light emitting efficiency, improved optical performance, and secured device stability. The composite hole functional layer made of mixed materials can reduce internal interfaces of the device, and the device only needs a single hole functional layer. Compared with respectively providing the hole injection layer and the hole transport layer, the single composite hole functional layer reduces the thickness of the hole functional layer, reduces the interface impedance and resistance of the hole functional layer, improves the injection and transmission efficiency of holes, facilitates the charge balance in the light-emitting layer, and further improves luminous efficiency of the device. On the other hand, the thickness of the electron functional layer is set close to the thickness corresponding to the first positive crest in the cavity standing wave of the electron functional material, and the thickness difference is within 5 nm, so that the device can be located near the first positive crest in the cavity standing wave. At such position, the device can have better current efficiency, better light emitting efficiency, and improved optical performance of the device. Moreover, with the thickening of the electron functional layer, the injection efficiency of electrons is slowed down, the quenching phenomenon caused by the injection efficiency of electrons in the device being higher than the injection efficiency of holes is avoided, so as to improve a balance of the recombination of electrons and holes in the light-emitting layer, and improve the luminescence efficiency of the device. In the fabrication method of the light-emitting device provided by the present disclosure, by adjusting the hole functional layer and/or the electron functional layer, the injection efficiency of electrons and holes in the light-emitting layer can be better balanced, and the recombination efficiency of electrons and holes is improved, thereby improving the luminous efficiency of the device, and prolonging the working life of the device. In addition, the fabrication method is easy to operate, and is thus suitable for large-scale industrial production and application.

Specifically, in the above step S10, a hole functional layer is disposed between a quantum dot light-emitting layer and an anode. The hole functional layer includes a mixed material of a hole transport material and a hole injection material. The thickness of the hole functional layer is selected from the thickness range corresponding to $1/3 \sim 2/3$ of the abscissa between the origin and the first positive trough in the cavity standing wave of the mixed material. In the embodiment of the present disclosure, the hole functional layer including a mixed material of the hole transport material and the hole injection material is arranged between the quantum-dot light-emitting layer and the anode, which not only reduces internal interfaces of the device, but allows the device to only need a single hole functional layer. Compared with respectively providing the hole injection layer and the hole transport layer, the single composite hole functional layer reduces the thickness of the hole functional layer, reduces the interface impedance and resistance of the hole functional layer, improves the injection and transmission efficiency of holes, facilitates the charge balance in the light-emitting layer, and further improves luminous efficiency of the device. In addition, the thickness of the hole functional layer is selected from the thickness range corresponding to $1/3 \sim 2/3$ of the abscissa between the origin and the first positive trough in the cavity standing wave of the mixed material. Due to the device microcavity effect, the thickness of the hole functional layer can be closer to the thickness corresponding to the crest of the cavity standing wave closest to the origin, so that the device can have better current efficiency and light emitting efficiency, improved optical performance.

In some embodiments, in the mixed material, the mass ratio of the hole transport material to the hole injection material is (10~15):(85~90). The mixed material with such ratio ensures both the hole transport efficiency and the injection efficiency of the hole functional layer. Doping is performed while the loss of the two material, i.e., the hole transport material and the hole injection material, is reduced as much as possible, so that the hole functional layer can exhibit relatively good hole transport and injection characteristics. If the percentage of the hole transport material is too high, the hole injection characteristics will be affected; while if the percentage of the hole transport material is too low, the hole transport efficiency in the functional layer will be affected.

In some embodiments, the step of determining the thickness of the hole functional layer includes: preparing a plurality of hole film layers of different thicknesses using the mixed material and applying the fabricated hole film layers to a light-emitting device, and determining a relationship graph of the current efficiency of the light-emitting device varies with respect to a change of the thickness of the hole film layer. The thickness of the hole functional layer can be selected from the thickness range corresponding to $1/3 \sim 2/3$ of the abscissa between the origin and the first positive trough shown in the relationship graph. According to some embodiments of the present disclosure, the thickness of the hole functional layer is selected from the thickness range corresponding to $1/3 \sim 2/3$ of the abscissa between the origin and the first positive trough in the cavity standing wave of the mixed material. The thickness of the hole functional layer can be closer to the thickness corresponding to the crest of the cavity standing wave closest to the origin. The device can have better current efficiency and light emitting efficiency. In addition, the thickness of the hole functional layer is significantly reduced, the device can have reduced internal interface, the interface impedance and resistance of the hole functional layer are reduced, the injection and transmission efficiency of holes are improved, thereby facilitating the charge balance in the light-emitting layer, and further improving luminous efficiency of the device. Moreover, the thickness range can also solve the problem that the hole functional layer is too thin and the device is easily broken down when the device is energized. As shown in FIGS. 2 and 3 corresponding to Embodiment 1 and Embodiment 2, due to the microcavity effect in the top-emitting device, the current efficiency of the device varying with the thickness of the functional thin ZnO film, forming a cavity standing wave. The crest of the cavity standing wave of the green quantum dot top-emitting device closet to the origin is in the negative range. However, it is impossible to realize the film having a negative thickness in practical applications. Therefore, in the embodiment of the present disclosure, the hole functional layer fabricated mixed doping of the two materials, i.e., the hole transport material and the hole injection material, can have reduced thickness. As such, the current efficiency of the device is closer to the crest near the origin, the current efficiency is higher, and the light emitting efficiency is better, so that better optoelectronic properties can be achieved.

In some embodiments, the thickness of the hole functional layer is 20~30 nm. In some embodiments of the present disclosure, the hole functional layer is fabricated by using a mixed material of a hole transport material and a hole injection material. Compared with respectively providing the hole injection layer and the hole transport layer, mixed doping of the two materials effectively reduces the thickness of the hole functional layer, where the thickness is only 20~30 nm; and it also reduces the interface impedance and resistance of the hole functional layer, improves the injection and transmission efficiency of holes, facilitates the charge balance in the light-emitting layer, and improves luminous efficiency of the device. In addition, the thinning of the hole functional layer makes the emission crest of the device closer to the thickness corresponding to the crest of the origin in the cavity standing wave closest to, thereby improving the optical performance of the device. The hole transport material and the hole injection material in the embodiments of the present disclosure may adopt any material capable of hole transport and injection. In some embodiments, the hole transport material is at least one selected from the group consisting of: poly(3-alkylthiophene), 1,2,4,5-tetrakis(trifluoromethyl)benzene, polysilanes, triphenylmethanes, and triarylamines. In some embodiments, the hole injection material is at least one selected from the group consisting of: poly(3,4-ethylenedioxythiophene): poly(styrenesulfonic acid), $WoO_3$, $MoO_3$, NiO, $V_2O_5$, 2,3,6,7,10,11-hexacyano-1,4,5,8,9,12-hexaazatriphenylene, and CuS. These hole transport materials and hole injection materials used in the embodiments of the present disclosure have excellent hole transport and injection efficiency. The materials after mixed doping have excellent hole transport and injection efficiency, and the thickness of the hole functional layer can be reduced, which enables the hole functional layer with relatively thin thickness can achieve the same hole transport and injection efficiency. In addition, by reducing the thickness of the hole functional layer, the performance of the device is closer to that corresponding to the crest position of the cavity standing wave near the origin, and the optoelectronic performance of the device can be improved.

Specifically, in the above step S20, an electron functional layer is arranged between the quantum dot light-emitting layer and the cathode, where the absolute value of the difference between the thickness of the electron functional layer between the cathode and the quantum dot light-emitting layer and the thickness corresponding to the first positive crest in the cavity standing wave of the electron functional material is equal to 5 nm. In the embodiment of the present disclosure, the thickness of the electron functional layer is set to be close to the thickness corresponding to the first positive crest in the cavity standing wave of the electron functional material, and the thickness difference is within 5 nm, so that the emission crest of the device is located in the vicinity of the first positive crest in the cavity standing wave of the electron functional material. At such position, the device can have a better current efficiency, better light emitting efficiency, and improved optical performance. Moreover, with the thickening of the electron functional layer, the injection efficiency of electrons is slowed down, the quenching phenomenon caused by the injection efficiency of electrons in the device being higher than the injection efficiency of holes is avoided, so as to improve a balance of the recombination of electrons and holes in the light-emitting layer, and improve the luminescence efficiency of the device.

In some embodiments, the step of determining the thickness corresponding to the first positive crest in the cavity standing wave of the electron functional material includes, preparing a plurality of electron films of different thickness using the electron functional material and applying the electron film in a light-emitting device, and plotting a relationship graph of the thickness of the electron film with respect to the current efficiency of the device. The thickness corresponding to the first positive crest in the relationship graph may be the thickness corresponding to the first positive crest in the cavity standing wave. The films of different thicknesses are fabricated using the electron functional material and the films are applied to light-emitting devices, generating a microcavity effect in the light-emitting device. Especially in the top emission device, there is a more significant microcavity effect. The current efficiency of the device varying with the thickness of the electron functional film, forming a cavity standing wave. The thickness corresponding to the first positive crest in the relationship graph of the thickness of the electron film with respect to the current efficiency of the device is the thickness corresponding to the first positive crest in the cavity standing wave. At such position, the current efficiency of the device reaches a crest, the device can have a good photoelectric performance, better luminous efficiency, and good luminous stability. In Embodiment 1 and as shown FIG. 1 corresponding Embodiment 1, due to the formation of a microcavity effect in the top-emitting device, the current efficiency of the device varies with the thickness of the ZnO film, forming a cavity standing wave. The crest of the cavity standing wave of the green quantum dot top-emitting device closet to the origin is in the negative range. However, it is impossible to realize the film having a negative thickness in practical applications. Therefore, in Embodiment 1 of the present disclosure, the thickness of the electron functional layer of the device is set to 150 nm (the thickness corresponding to the first positive crest in the cavity standing wave). At this position, the current efficiency of the device is better compared to the thickness of 40~50 nm by the conventional electron functional layer. Furthermore, the optoelectronic properties, resistance, and charge balance of the device can be better balanced.

In some embodiments, the step of preparing the electron functional layer includes: under a protective gas atmosphere with a working pressure of 1.5-2 Pa, at a temperature of 400° C.~450° C., a distance to target of 5.5 cm to 6.5 cm, a power of 150 W~200 W, sputtering depositing the electron functional material until the absolute value of the difference between the thickness of the electron functional material and the thickness corresponding to the first positive crest is equal to 5 nm. The step of disposing the electron functional layer between the quantum dot light-emitting layer and the cathode in the embodiments of the present disclosure adopts the method of sputtering deposition, so that the fabricated functional layer is smoother and denser, which overcomes the problem that spin coating and other processes needs to adopt multiple spin coating to thicken the film and the film has deficiencies such as nonuniformity, poor bonding stability, etc. Therefore, the device stability is better and the working life is longer.

In some embodiments, the electron functional material is at least one selected from a group consisting of: ZnO, ZnMgO, ZnMgLiO, ZnInO, ZrO, $ZrO_2$, $TiO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, and 4,7-Diphenyl-1,10-phenanthroline. These electron functional materials used in the embodiments of the present disclosure have good electron transport and injection effects, ensuring the balance of electrons and holes in the light-emitting layer of the device, balancing the charges in the light-emitting layer, and ensuring the light-emitting efficiency of the device.

The quantum dot light-emitting layer of the light-emitting device in the embodiments of the present disclosure may use any quantum dot material, for example, in some embodiments, the quantum dot material includes but is not limited to at least one of semiconductor compounds of Group II-IV, Group II-VI, Group II-V, Group III-V, Group III-VI, Group IV-VI, Group I-III-VI, Group II-IV-VI, Group II-IV-V, or a core-shell structure semiconductor compound composed of at least two of the above-mentioned semiconductor compounds. In some specific embodiments, the quantum dot material is at least one semiconductor nanocrystalline compound selected from CdSe, CdS, CdTe, ZnO, ZnSe, ZnS, ZnTe, HgS, HgSe, HgTe, CdZnSe, or a semiconducting nanocrystalline compound of at least a mixed type, a gradient mixed type, a core-shell structure type, or a coordinated type, etc., of two of the above. In other specific embodiments, the quantum dot material is at least one semiconductor nanocrystalline compound selected from: InAs, InP, InN, GaN, InSb, InAsP, InGaAs, GaAs, GaP, GaSb, AlP, AlN, AlAs, AlSb, CdSeTe, and ZnCdSe, or a semiconducting nanocrystalline compound of at least a mixed type, a gradient mixed type, a core-shell structure type, or a coordinated type, etc., of two of the above. In some other embodiments, the quantum dot material is at least one selected from perovskite nanoparticle materials (especially luminescent perovskite nanoparticle materials), metal nanoparticle materials, and metal oxide nanoparticle materials. The above-mentioned quantum dot materials have the characteristics of quantum dots and have good optoelectronic properties.

Figure 5:
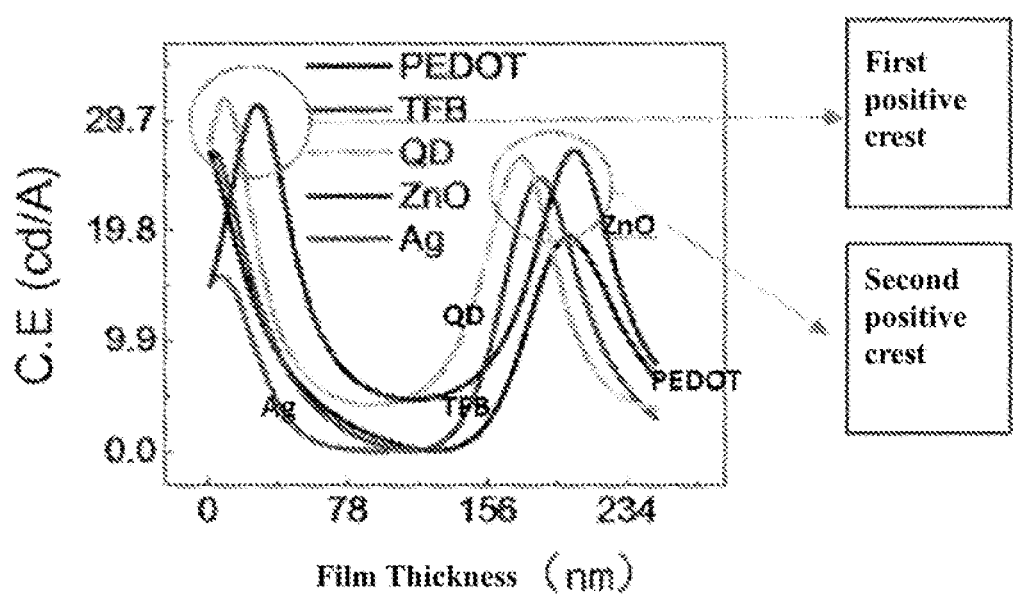
FIG. 5 schematically shows a relationship graph of a thickness of each functional film layer with respect to the current efficiency in a red light top-emitting device according to some embodiments of the present disclosure.

In some embodiments, the quantum dot material is at least one selected from a blue light quantum dot material and a green light quantum dot material. The fabrication method of the light-emitting device in the embodiment of the present disclosure is more suitable for the light-emitting device of the blue light quantum dot material and the green light quantum dot material. As shown in FIG. 5 (the abscissa is the thickness, and the ordinate is the current efficiency), in the cavity standing wave of the microcavity effect formed in the red quantum dot light-emitting device, the crest closest to the origin is in the positive region. At present, the applied thickness of each functional layer in the red quantum dot top-emitting device is approximately close to the first positive crest. However, the crest in the cavity standing wave of the blue-green quantum dot top-emitting device closest to the origin is in the negative region, resulting in poor optical performance of the blue or green quantum dot device. In order to improve the performance of the device in the embodiments of the present disclosure, by adjusting the thickness of the electronic functional layer and/or the hole functional layer, the cavity length of the microcavity is adjusted, and the optical performance and electrical performance of the device can be adjusted at the same time, so that the light extraction efficiency of the device is better. Better stability and longer life.

Correspondingly, the embodiments of the present disclosure also provide a light-emitting device, including an anode and a cathode disposed opposite to each other, a quantum dot light-emitting layer disposed between the anode and the cathode, a hole functional layer disposed between the anode and the quantum dot light-emitting layer, and an electron functional layer disposed between the cathode and the quantum dot light-emitting layer. The hole functional layer includes a mixed material of a hole transport material and a hole injection material. The thickness of the hole functional layer is selected from the thickness range corresponding to $1/3 \sim 2/3$ of the abscissa between the origin and the first positive trough in the cavity standing wave of the mixed material; and/or, an absolute value of a difference between a thickness of the electron functional layer and a thickness corresponding to a first positive crest of a cavity standing wave of the electron functional material is less than or equal to 5 nm.

In the light-emitting device provided in the embodiments of the present disclosure, the hole functional layer disposed between the anode and the quantum dot light-emitting layer includes a mixed material of a hole transport material and a hole injection material, and the thickness of the hole functional layer is selected from the thickness range corresponding to $1/3 \sim 2/3$ of the abscissa between the origin and the first positive trough in the cavity standing wave of the mixed material. The hole functional layer having a thickness closer to the thickness corresponding to the crest of the cavity standing wave is fabricated by material mixed doping, which improves the current efficiency and luminous efficiency of the device, reduces internal interfaces of the device, reduces the thickness of the hole functional layer, reduces the interface impedance and resistance of the hole functional layer, improves the injection and transmission efficiency of holes, facilitates the charge balance in the light-emitting layer, and further improves luminous efficiency of the device. The absolute value of the difference between the thickness of the electron functional layer between the cathode and the quantum dot light-emitting layer and the thickness corresponding to the first positive crest in the cavity standing wave of the electron functional material is equal to 5 nm, so that the device is located in the vicinity of the first positive crest in the cavity standing wave. At such position, the device has better current efficiency and light emitting efficiency, and improved optical performance. Moreover, the recombination efficiency of electrons and holes in the light-emitting layer can be balanced, and the light-emitting efficiency of the device can be improved.

In some embodiments, the light-emitting devices described in the embodiments of the present disclosure are divided based on a positive type structure and an inverse type structure.

In one embodiment, the positive type structure light-emitting device includes a stacked structure of oppositely disposed anode and cathode, a quantum dot light-emitting layer disposed between the anode and the cathode, and the anode is disposed on a substrate. A hole functional layer is also arranged between the anode and the quantum dot light-emitting layer; and an electron functional layer is also arranged between the cathode and the quantum dot light-emitting layer.

In one embodiment, the inversion type structure light-emitting device includes a stacked structure of oppositely disposed anode and cathode, a quantum dot light-emitting layer disposed between the anode and the cathode, and the cathode disposed on a substrate. A hole functional layer is also arranged between the anode and the quantum dot light-emitting layer; and an electron functional layer is also arranged between the cathode and the quantum dot light-emitting layer.

In some further embodiments, the substrate layer may include a rigid substrate, flexible substrate, etc.

The Anode may include: ITO, FTO, or ZTO, etc.;

The hole functional layer includes a mixed material of at least one hole injection material selected from poly(3,4-ethylenedioxythiophene), poly(styrenesulfonic acid), $WoO_3$, $MoO_3$, NiO, $V_2O_5$, 2,3,6,7,10,11-hexacyano-1,4,5,8,9,12-hexaazatriphenylene, and CuS, and at least one hole transport material selected from poly(3-alkylthiophene), 1,2,4,5-tetrakis(trifluoromethyl)benzene, polysilanes, triphenylmethanes, and triarylamines. The mass ratio is (10-15):(85-90); and the thickness of the hole functional layer is 20~30 nm.

The quantum dot light-emitting layer includes at least one quantum dot material selected from a blue light quantum dot material and a green light quantum dot material.

Electron transport layers include at least one of ZnO, ZnMgO, ZnMgLiO, ZnInO, ZrO, $ZrO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, and 4,7-Diphenyl-1,10-phenanthroline.

The cathode includes Al, Ag, Au, Cu, Mo, or their alloys.

In some specific embodiments, the light-emitting device is a positively disposed bottom-emitting structure, including: a hole injection layer disposed on a transparent anode substrate, a hole transport layer disposed on the hole injection layer, a quantum dot light-emitting layer disposed on the hole transport layer, an electron transport layer disposed on the quantum dot light-emitting layer, and a metal cathode disposed on the electron transport layer. The reflectivity of the cathode with respect to the visible light is not less than 98%.

In some specific embodiments, the light-emitting device is a positively disposed top-emitting structure, including: a hole injection layer disposed on a transparent anode substrate; a hole transport layer disposed on the hole injection layer, a quantum dot light-emitting layer disposed on the hole transport layer, an electron transport layer disposed on the quantum dot light-emitting layer, a cathode disposed on the transition layer. The transmittance of the cathode with respective to the visible light is not less than 90%.

In some specific embodiments, the light-emitting device is an inversely disposed bottom-emitting structure, including: an electron transport layer disposed on a cathode substrate; a quantum dot light-emitting layer disposed on the electron transport layer, a hole transport layer disposed on the quantum dot light-emitting layer, a hole injection layer disposed on the hole transport layer, a metal anode disposed on the hole injection layer. The reflectivity of the anode with respect to the visible light is not less than 98%.

In some specific embodiments, the light-emitting device is an inversely disposed top-emitting structure, including: an electron transport layer disposed on a cathode substrate, a quantum dot light-emitting layer disposed on the electron transport layer, a hole transport layer disposed on the quantum dot light-emitting layer, a hole injection layer disposed on the hole transport layer; and an anode disposed on the hole injection layer. The transmittance of the anode with respect to the visible light is not less than 90%.

In order to make the above-mentioned implementation details and operations of the present disclosure clearly understood by those skilled in the art, and to significantly reflect the improved performance of the light-emitting devices and their fabrication methods in the embodiments of the present disclosure, the above technical solutions are illustrated by the plurality of embodiments below.

Embodiment 1

A fabrication method of a green quantum dot light-emitting device includes the following steps.

Step S1: PEDOT:PSS is spin coated on to a silver-plated ITO glass substrate at a rotational speed of 5000 rpm. The spin-coating time is 30 seconds. the spin-coating is heated for 15 minutes at a temperature of 150° C. to obtain a hole injection layer with a thickness of 20~30 nm.

Step S2: 8 mg/ml of TFB is spin coated on the PEDOT:PSS hole injection layer of the device at a rotational speed of 4000 rpm. The spin-coating time is 30 seconds. The spin-coating is heated for 30 minutes at a temperature of 150° C. to obtain a TFB hole transport layer with a thickness of 15-30 nm.

Step S3: CdZnSe/ZnS green quantum dots with a concentration of 20 mg/mL is spin coated on the TFB film at a rotational speed of 3000 rpm for 30 seconds to obtain a quantum dot light-emitting layer.

Step S4: Films with different thicknesses are fabricated using ZnO, and applied to the top-emitting device. The relationship graph of the thickness of the ZnO film with respect to the current efficiency of the device is plotted (as shown in FIG. 2, the abscissa is the thickness, and the ordinate is the current efficiency). The relationship graph shows that the thickness corresponding to the first positive crest of the cavity standing wave of the ZnO film is 150 nm. On the quantum dot light-emitting layer, a ZnO film with a thickness of 150 nm is fabricated by a magnetic sputtering process with the magnetic sputtering parameters: substrate temperature at 400° C., distance to target at 6 cm, partial pressure ratio of argon to oxygen at 9:4, power at 170 W, and working pressure at 1.5 Pa, to obtain a ZnO electron transport layer.

Step S5: Ag electrode is evaporating-plated. The Ag electrode is plated with aluminum by metal thermal evaporation process with vacuum degree not higher than $3 \times 10^{-4}$ Pa, speed at 1 Å/s, time at 200 seconds, and thickness 20 nm;

Step S6: the capping layer (CPL) is evaporating-plated. The CPL is evaporating-pated through a thermal evaporation process, with a vacuum degree not higher than $3 \times 10^{-4}$ Pa, a speed at 1 Å/s, a time at 600 seconds, and the thickness at 60 nm to obtain green light quantum dot top-emitting device.

Embodiment 2

A fabrication method of a green light quantum dot top-emitting device includes the following steps.

Step S2: the solution A is spin-coated on the Ag plated ITO glass substrate at a rotational speed of 4000 rpm, with the spin-coating time 30 seconds, and the spin-coating heated for 15 minutes at a temperature of 150° C. to obtain a hole functional layer with 20~30 nm thickness.

Step S3: CdZnSe/ZnS green quantum dots are spin-coated onto the hole functional layer of the device with a concentration of 20 mg/mL at a rotational speed of 3000 rpm for 30 seconds to obtain a quantum dot light-emitting layer.

Step S4: the IZO precursor solution is spin-coated on the quantum dot light-emitting layer at a rotational speed of 3000 rpm, with the spin-coating time 30 seconds, to obtain an IZO electron transport layer.

Step S5: Ag electrode is evaporating-plated. The Ag electrode is plated with aluminum by metal thermal evaporation process with vacuum degree not higher than $3\times10^{-4}$ Pa, speed at 1 Å/s, time at 200 seconds, and thickness 20 nm.

Step S6: the capping layer (CPL) is evaporating-plated. The CPL is evaporating-pated through a thermal evaporation process, with a vacuum degree not higher than $3\times10^{-4}$ Pa, a speed at 1 Å/s, a time at 600 seconds, and the thickness at 60 nm to obtain green light quantum dot top-emitting device.

Embodiment 3

A fabrication method of a green light quantum dot top-emitting device includes the following steps.

Step S1: TFB is doped into PEDOT:PSS at a ratio of 12% to obtain solution A.

Step S2: the solution A is spin-coated on the Ag plated ITO glass substrate at a rotational speed of 4000 rpm, with the spin-coating time 30 seconds, and the spin-coating heated for 15 minutes at a temperature of 150° C. to obtain a hole functional layer with 20~30 nm thickness.

Step S3: CdZnSe/ZnS green quantum dots are spin-coated onto the hole injection/transport layer of the device with a concentration of 20 mg/mL at a rotational speed of 3000 rpm for 30 seconds to obtain a quantum dot light-emitting layer.

Step S4: Films with different thicknesses are fabricated using ZnO, and applied to the top-emitting device. The relationship graph of the thickness of the ZnO film with respect to the current efficiency of the device is plotted (as shown in FIG. 3, the abscissa is the thickness, and the ordinate is the current efficiency). The relationship graph shows when the hole functional layer of the device adopts a composite layer of the hole transport material mixed and inter-doped with the hole injection material, the thickness of the hole functional layer is reduced, and when the cavity length is adjusted, the thickness of ZnO increased accordingly, and the thickness corresponding to the first positive crest of the cavity standing wave of the ZnO film is 160 nm. On the quantum dot light-emitting layer, a ZnO film with a thickness of 160 nm is fabricated by a magnetic sputtering process with the magnetic sputtering parameters: substrate temperature at 400° C., distance to target at 6 cm, partial pressure ratio of argon to oxygen at 9:4, power at 170 W, and working pressure at 1.5 Pa, to obtain a ZnO electron transport layer.

Step S5: Ag electrode is evaporating-plated. The Ag electrode is plated with aluminum by metal thermal evaporation process with vacuum degree not higher than $3\times10^{-4}$ Pa, speed at 1 Å/s, time at 200 seconds, and thickness 20 nm.

Step S6: the capping layer (CPL) is evaporating-plated. The CPL is evaporating-pated through a thermal evaporation process, with a vacuum degree not higher than $3\times10^{-4}$ Pa, a speed at 1 Å/s, a time at 600 seconds, and the thickness at 60 nm to obtain green light quantum dot top-emitting device.

Comparative Example 1

A fabrication method of a green light quantum dot top-emitting device includes the following steps.

Step S1: PEDOT:PSS is spin coated on to a silver-plated ITO glass substrate at a rotational speed of 5000 rpm. The spin-coating time is 30 seconds. the spin-coating is heated for 15 minutes at a temperature of 150° C. to obtain a hole injection layer with a thickness of 20~30 nm.

Step S2: 8 mg/ml of TFB is spin coated on the PEDOT: PSS hole injection layer of the device at a rotational speed of 4000 rpm. The spin-coating time is 30 seconds. The spin-coating is heated for 30 minutes at a temperature of 150° C. to obtain a TFB hole transport layer with a thickness of 15-30 nm.

Step S3: CdZnSe/ZnS green quantum dots with a concentration of 20 mg/mL is spin coated on the TFB film at a rotational speed of 3000 rpm for 30 seconds to obtain a quantum dot light-emitting layer;

Step S4: A ZnO precursor solution is spin-coated on the quantum dot light-emitting layer at a rotational speed of 3000 rpm for 30 seconds to obtain a ZnO electron transport layer with a thickness of 50 nm;

Step S5: Ag electrode is evaporating-plated. The Ag electrode is plated with aluminum by metal thermal evaporation process with vacuum degree not higher than $3\times10^{-4}$ Pa, speed at 1 Å/s, time at 200 seconds, and thickness 20 nm;

Step S6: the capping layer (CPL) is evaporating-plated. The CPL is evaporating-pated through a thermal evaporation process, with a vacuum degree not higher than $3\times10^{-4}$ Pa, a speed at 1 Å/s, a time at 600 seconds, and the thickness at 60 nm to obtain green light quantum dot top-emitting device.

In order to verify the progress of the green light quantum dot top-emitting device fabricated in the embodiments of the present disclosure and the fabrication method thereof, a performance test is conducted in the embodiments of the present disclosure.

Test Example 1

In this test example, the relationship of the thickness of the hole functional layer in the device of Embodiment 2 and the hole transport layer and the hole injection layer in the device of Comparative Example 1 with respect to the current efficiency of the device are respectively tested and analyzed, as shown in FIG. 4 (the abscissa is the thickness, and the ordinate is the current efficiency), under the condition of the same film thickness, the current efficiency of the device using the mixture of the hole transport material and the hole injection material to make the hole functional layer in Example 2 is relatively The current efficiency for the individual layers in Comparative Example 1 is high. Example 2 The thickness of the hole functional layer is reduced as a whole, which not only reduces the resistance of the hole functional layer, improves the efficiency of hole transport and injection, but also makes the emission crest of the device closer to the crest of the cavity standing wave, improving the optoelectronic performance of the device.

Test Example 2

In this test example, two groups of parallel tests were performed on the external quantum efficiency, device lighting voltage, and maximum luminance of the devices of Embodiment 2 and comparative Example 1. The test results are shown in Table 1 below.

TABLE 1

| Testing item/ Testing object | Max (%) | Avg (%) | VI (V) | VIK (V) | LumiMax (nit) |
|---|---|---|---|---|---|
| Comparative Example 1 | 1.1 | 1.0 | 2 | 3.2 | 7140.3 |
| Comparative Example 1 | 0.8 | 0.8 | 2 | 3.6 | 4179.1 |
| Embodiment 2 | 5.4 | 5.2 | 2.1 | 4.1 | 14512.5 |
| Embodiment 2 | 5.7 | 5.3 | 2.5 | 3.8 | 15777.9 |

Note:
Max - maximum value of external quantum efficiency; Avg - average value of external quantum efficiency; VI - device turn-on voltage; VIK - voltage when device luminance reaches 1000 nit; LumiMax - device luminance maximum value at a certain voltage.

It can be seen from the above test results that the external quantum efficiency and luminance performance of the device fabricated in Example 2 of the present disclosure in which the hole transport layer is doped into the hole injection layer of the composite hole functional layer are obviously better than those of the device fabricated in Comparative Example 1 in which the hole transport layer and hole injection layer are fabricated as separate layers.

Test Example 3

In this test example, tests were performed on the life performance of the devices of Embodiments 1 to 3 and Comparative Example 1 respectively, and the test results are shown in Table 2 below.

TABLE 2

| Testing items/Testing objects | Init L (nit) | T95 (h) | T95-1K (h) |
|---|---|---|---|
| Embodiment 1 | 17311 | 0.77 | 98.02 |
| Embodiment 2 | 19642 | 0.74 | 117.56 |
| Embodiment 3 | 21268 | 2.03 | 366.57 |
| Comparative Example 1 | 5695 | 0.67 | 12.83 |

Note:
Init L is the initial luminance; T95 working life refers to when the device is driven with a constant current, the luminance is L0, and when L0 decays to 95%, the time taken is recorded as the working life; and T95-1K refers to when the device luminance is 1000 nit, the time it takes for the luminance to decay to 95%.

It can be seen from the above test results that compared to comparative Example 1, the devices fabricated in Embodiments 1 to 3 of the present disclosure has much better initial luminance, and better luminous performance, and significantly better optical life than that of the device of Comparative Example 1, and better stability. In particular, the device of embodiment 3, which improved both the hole functional layer and the electron functional layer at the same time, has more excellent brightness and lifetime.

The above are only optional embodiments of the present disclosure, and are not intended to limit the present disclosure. Various modifications and variations of this application are possible for those skilled in the art. Any modification, equivalent replacement, improvement, etc. made within the spirit and principle of this application shall be included within the scope of the claims of this application.

A fabrication method for a light-emitting device according to embodiments of the present disclosure includes the following steps.

In some embodiments, a hole functional layer is disposed between a quantum dot light-emitting layer and an anode. The hole functional layer includes a mixed material of a hole transport material and a hole injection material. The thickness of the hole functional layer is selected from the thickness range corresponding to ⅓~⅔ of the abscissa between the origin and the first positive trough in the cavity standing wave of the mixed material.

In some embodiments, an electron functional layer is disposed between the quantum dot light-emitting layer and a cathode. An absolute value of a difference between a thickness of the electron functional layer and a thickness corresponding to a first positive crest of a cavity standing wave of the electron functional material is less than or equal to 5 nm.

In the fabrication method for the light-emitting device according to some embodiments of the present disclosure, the mass ratio of the hole transport material to the hole injection material in the mixed material is (10~15):(85~90).

In the fabrication method for the light-emitting device according to some embodiments of the present disclosure, determining the thickness of the hole functional layer may include preparing a plurality of hole film layers of different thicknesses using the mixed material and applying the fabricated hole film layers to a light-emitting device, and determining a relationship graph showing the current efficiency of the light-emitting device varies with a change of the thickness of the hole film layer. The thickness of the hole functional layer can be selected from the thickness range corresponding to ⅓~⅔ of the abscissa between the origin and the first positive trough shown in the relationship graph.

In the fabrication method for the light-emitting device according to some embodiments of the present disclosure, the thickness of the hole functional layer is 20~30 nm.

In the fabrication method for the light-emitting device according to some embodiments of the present disclosure, determining the thickness corresponding to the first positive crest in the cavity standing wave of the electron functional material includes preparing a plurality of electron films of different thickness using the electron functional material and applying the electron film in a light-emitting device, and plotting a relationship graph of the thickness of the electron film with respect to the current efficiency of the device. The thickness corresponding to the first positive crest in the relationship graph may be the thickness corresponding to the first positive crest in the cavity standing wave.

In the fabrication method for the light-emitting device according to some embodiments of the present disclosure, preparing the electron functional layer includes: under a protective gas atmosphere with a working pressure of 1.5-2 Pa, at a temperature of 400° C.~450° C., a distance to target of 5.5 cm to 6.5 cm, a power of 150 W~200 W, sputtering depositing the electron functional material until the absolute value of the difference between the thickness of the electron functional material and the thickness corresponding to the first positive crest is equal to 5 nm.

In the fabrication method for the light-emitting device according to some embodiments of the present disclosure, the hole transport material is at least one selected from the group consisting of: poly(3-alkylthiophene), 1,2,4,5-tetrakis(trifluoromethyl)benzene, polysilanes, triphenylmethanes, and triarylamines.

In the fabrication method for the light-emitting device according to some embodiments of the present disclosure, the hole injection material is at least one selected from the group consisting of: poly(3,4-ethylenedioxythiophene): poly(styrenesulfonic acid), $WO_3$, $MoO_3$, NiO, $V_2O_5$, 2,3,6,7,10,11-hexacyano-1,4,5,8,9,12-hexaazatriphenylene, and CuS.

In the fabrication method for the light-emitting device according to some embodiments of the present disclosure, the electron functional material is at least one selected from a group consisting of: ZnO, ZnMgO, ZnMgLiO, ZnInO, ZrO, $ZrO_2$, $TiO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, and 4,7-Diphenyl-1,10-phenanthroline.

In the fabrication method for the light-emitting device according to some embodiments of the present disclosure, the quantum dot material is at least one selected from a blue light quantum dot material and a green light quantum dot material.

A light-emitting device according to some embodiments of the present disclosure includes an anode and a cathode disposed opposite to each other, a quantum dot light-emitting layer disposed between the anode and the cathode, a hole functional layer disposed between the anode and the quantum dot light-emitting layer, and an electron functional layer disposed between the cathode and the quantum dot light-emitting layer. The hole functional layer includes a mixed material of a hole transport material and a hole injection material. The thickness of the hole functional layer is selected from the thickness range corresponding to ⅓~⅔ of the abscissa between the origin and the first positive trough in the cavity standing wave of the mixed material; and/or, an absolute value of a difference between a thickness of the electron functional layer and a thickness corresponding to a first positive crest of a cavity standing wave of the electron functional material is less than or equal to 5 nm.

In the light-emitting device according to some embodiments of the present disclosure, the mass ratio of the hole transport material to the hole injection material is (10~15): (85~90).

In some embodiments, the thickness of the hole functional layer is 20~30 nm.

In the light-emitting device according to some embodiments of the present disclosure, the hole transport material is at least one selected from the group consisting of: poly (3-alkylthiophene), 1,2,4,5-tetrakis(trifluoromethyl)benzene, polysilanes, triphenylmethanes, and triarylamines.

In the light-emitting device according to some embodiments of the present disclosure, the hole injection material is at least one selected from the group consisting of: poly (3,4-ethylenedioxythiophene): poly(styrenesulfonic acid), $WoO_3$, $MoO_3$, NiO, $V_2O_5$, 2,3,6,7,10,11-hexacyano-1,4,5,8,9,12-hexaazatriphenylene, and CuS.

In the light-emitting device according to some embodiments of the present disclosure, the electron functional material is at least one selected from a group consisting of: ZnO, ZnMgO, ZnMgLiO, ZnInO, ZrO, $ZrO_2$, $TiO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, and 4,7-Diphenyl-1,10-phenanthroline.

In the light-emitting device according to some embodiments of the present disclosure, the quantum dot material is at least one selected from a blue light quantum dot material and a green light quantum dot material.

In the light-emitting device according to some embodiments of the present disclosure, the light-emitting device is a positively disposed top-emitting structure, including: a hole injection layer disposed on a transparent anode substrate; a hole transport layer disposed on the hole injection layer; a quantum dot light-emitting layer disposed on the hole transport layer; an electron transport layer disposed on the quantum dot light-emitting layer; and a cathode disposed on the transition layer. The transmittance of the cathode with respective to the visible light is not less than 90%.

In the light-emitting device according to some embodiments of the present disclosure, the light-emitting device is an inversely disposed bottom-emitting structure, including: an electron transport layer disposed on a cathode substrate; a quantum dot light-emitting layer disposed on the electron transport layer; a hole transport layer disposed on the quantum dot light-emitting layer; a hole injection layer disposed on the hole transport layer; and a metal anode disposed on the hole injection layer. The reflectivity of the anode with respect to the visible light is not less than 98%.

In the light-emitting device according to some embodiments of the present disclosure, the light-emitting device is an inversely disposed top-emitting structure, including: an electron transport layer disposed on a cathode substrate; a quantum dot light-emitting layer disposed on the electron transport layer; a hole transport layer disposed on the quantum dot light-emitting layer; a hole injection layer disposed on the hole transport layer; and an anode disposed on the hole injection layer. The transmittance of the anode with respect to the visible light is not less than 90%.

In the light-emitting device according to some embodiments of the present disclosure, the light-emitting device is a positively disposed bottom-emitting structure, including: a hole injection layer disposed on a transparent anode substrate; a hole transport layer disposed on the hole injection layer; a quantum dot light-emitting layer disposed on the hole transport layer; an electron transport layer disposed on the quantum dot light-emitting layer; and a metal cathode disposed on the electron transport layer. The reflectivity of the cathode with respect to the visible light is not less than 98%.

What is claimed is:

1. A fabrication method for a light-emitting device, comprising:
   providing a hole functional layer disposed between a quantum dot light-emitting layer and an anode, wherein the hole functional layer includes a mixed material of a hole transport material and a hole injection material, and a thickness of the hole functional layer is selected from a thickness range corresponding to ⅓~⅔ of abscissa between an origin and a first positive trough in a cavity standing wave of the mixed material; and
   providing an electron functional layer disposed between the quantum dot light-emitting layer and a cathode, wherein an absolute value of a difference between a thickness of the electron functional layer and a thickness corresponding to a first positive crest of a cavity standing wave of an electron functional material is less than or equal to 5 nm.

2. The fabrication method for the light-emitting device according to claim 1, wherein:
   in the mixed material, a mass ratio of the hole transport material to the hole injection material is (10~15): (85~90).

3. The fabrication method for the light-emitting device according to claim 1, further comprising:
   determining the thickness of the hole functional layer, including:
   preparing a plurality of hole film layers of different thicknesses using the mixed material and applying the fabricated hole film layers to a light-emitting device; and
   determining a relationship graph showing that a current efficiency of the light-emitting device varies with a change of a thickness of the hole film layer, wherein the thickness of the hole functional layer is selected from a thickness range corresponding to ⅓~⅔ of the abscissa between the origin and the first positive trough shown in the relationship graph.

4. The fabrication method for the light-emitting device according to claim 3, wherein the thickness of the hole functional layer is in a range of 20~30 nm.

5. The fabrication method for the light-emitting device according to claim 1, further comprising:
   determining the thickness corresponding to the first positive crest in the cavity standing wave of the electron functional material, including:

preparing a plurality of electron films of different thickness using the electron functional material and applying the electron film in a light-emitting device; and plotting a relationship graph of a thickness of the electron film with respect to a current efficiency of the device, wherein a thickness corresponding to a first positive crest in the relationship graph is the thickness corresponding to the first positive crest in the cavity standing wave.

6. The fabrication method for the light-emitting device according to claim 1, wherein providing the electron functional layer includes:

under a protective gas atmosphere with a working pressure of 1.5-2 Pa, at a temperature of 400° C.~450° C., a distance to target of 5.5 cm to 6.5 cm, and a power of 150 W~200 W, sputtering depositing the electron functional material until the absolute value of the difference between the thickness of the electron functional material and the thickness corresponding to the first positive crest is equal to 5 nm.

7. The fabrication method for the light-emitting device according to claim 1, wherein the hole transport material includes at least one of:

poly(3-alkylthiophene), 1,2,4,5-tetrakis(trifluoromethyl) benzene, polysilanes, triphenylmethanes, or triarylamine.

8. The fabrication method for the light-emitting device according to claim 1, wherein the hole injection material includes at least one of:

poly(3,4-ethylenedioxythiophene): poly(styrenesulfonic acid), $WoO_3$, $MoO_3$, NiO, $V_2O_5$, 2,3,6,7,10,11-hexacyano-1,4,5,8,9,12-hexaazatriphenylene, or CuS.

9. The fabrication method for the light-emitting device according to claim 1, wherein the electron functional material includes at least one of:

ZnO, ZnMgO, ZnMgLiO, ZnInO, ZrO, $ZrO_2$, $TiO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, or 4,7-Diphenyl-1,10-phenanthroline.

10. The fabrication method for the light-emitting device according to claim 1, wherein the quantum dot material includes at least one of a blue light quantum dot material or a green light quantum dot material.

11. A light-emitting device, comprising:

an anode and a cathode disposed opposite to each other; a quantum dot light-emitting layer disposed between the anode and the cathode;

a hole functional layer disposed between the anode and the quantum dot light-emitting layer; and an electron functional layer disposed between the cathode and the quantum dot light-emitting layer;

wherein:

the hole functional layer includes a mixed material of a hole transport material and a hole injection material;

the thickness of the hole functional layer is selected from a thickness range corresponding to ⅓~⅔ of abscissa between an origin and a first positive trough in a cavity standing wave of the mixed material; and/or an absolute value of a difference between a thickness of the electron functional layer and a thickness corresponding to a first positive crest of a cavity standing wave of an electron functional material is less than or equal to 5 nm.

12. The light-emitting device according to claim 11, wherein:

in the mixed material, a mass ratio of the hole transport material to the hole injection material is (10~15): (85~90); and/or the thickness of the hole functional layer is 20~30 nm.

13. The light-emitting device according to claim 11, wherein the hole transport material includes at least one of:

poly(3-alkylthiophene), 1,2,4,5-tetrakis(trifluoromethyl) benzene, polysilanes, triphenylmethanes, or triarylamine.

14. The light-emitting device according to claim 11, wherein the hole injection material includes at least one of:

poly(3,4-ethylenedioxythiophene), poly(styrenesulfonic acid), $WoO_3$, $MoO_3$, NiO, $V_2O_5$, 2,3,6,7,10,11-hexacyano-1,4,5,8,9,12-hexaazatriphenylene, or CuS.

15. The light-emitting device according to claim 11, wherein the electron functional material includes at least one of:

ZnO, ZnMgO, ZnMgLiO, ZnInO, ZrO, $ZrO_2$, $TiO_2$, $SnO_2$, $Ta_2O_3$, NiO, TiLiO, $Alq_3$, 3-(Biphenyl-4-yl)-5-(4-tert-butylphenyl)-4-phenyl-4H-1,2,4-triazole, 1,3,5-Tris(1-phenyl-1H-benzimidazol-2-yl)benzene, 2-(4'-tert-butylphenyl)-5-(4'-biphenyl)-1,3,4-oxadiazole, 2,9-Dimethyl-4,7-diphenyl-1,10-phenanthroline, or 4,7-Diphenyl-1,10-phenanthroline.

16. The light-emitting device according to claim 11, wherein the quantum dot material includes at least one of a blue light quantum dot material or a green light quantum dot material.

17. The light-emitting device according to claim 11, wherein the light-emitting device includes:

a positively disposed top-emitting structure, including:
the hole functional layer including:
a hole injection layer disposed on the anode, the anode being a transparent anode substrate; and
a hole transport layer disposed on the hole injection layer;
the quantum dot light-emitting layer disposed on the hole transport layer;
the electron functional layer including an electron transport layer disposed on the quantum dot light-emitting layer; and
the cathode disposed on the electron transport layer, a transmittance of the cathode with respective to visible light being not less than 90%.

18. The light-emitting device according to claim 12, wherein the light-emitting device includes:

an inversely disposed bottom-emitting structure, including:
the electron functional layer including an electron transport layer disposed on the cathode, the cathode being a cathode substrate;
the quantum dot light-emitting layer disposed on the electron transport layer;
the hole functional layer including:
a hole transport layer disposed on the quantum dot light-emitting layer; and
a hole injection layer disposed on the hole transport layer; and
the anode disposed on the hole injection layer, the anode being a metal anode, and a reflectivity of the anode with respect to visible light being not less than 98%.

19. The light-emitting device according to claim 12, wherein the light-emitting device includes:
an inversely disposed top-emitting structure, including:
the electron functional layer including an electron transport layer disposed on the cathode, the cathode being a cathode substrate;
the quantum dot light-emitting layer disposed on the electron transport layer;
the hole functional layer including:
a hole transport layer disposed on the quantum dot light-emitting layer; and
a hole injection layer disposed on the hole transport layer; and
an anode disposed on the hole injection layer, a transmittance of the anode with respect to visible light being not less than 90%.

20. The light-emitting device according to claim 12, wherein light-emitting device includes:
a positively disposed bottom-emitting structure, including:
the hole functional layer including:
a hole injection layer disposed on a transparent anode substrate; and
a hole transport layer disposed on the hole injection layer;
a quantum dot light-emitting layer disposed on the hole transport layer;
the electron functional layer including an electron transport layer disposed on the quantum dot light-emitting layer; and
the cathode disposed on the electron transport layer, the cathode being a metal cathode, and a reflectivity of the cathode with respect to visible light being not less than 98%.

* * * * *